United States Patent
Xu

(10) Patent No.: US 11,860,220 B2
(45) Date of Patent: Jan. 2, 2024

(54) METHOD FOR EVALUATING HOT CARRIER INJECTION EFFECT OF DEVICE

(71) Applicant: CHANGXIN MEMORY TECHNOLOGIES, INC., Anhui (CN)

(72) Inventor: QiAn Xu, Hefei (CN)

(73) Assignee: CHANGXIN MEMORY TECHNOLOGIES, INC, Anhui (CN)

( * ) Notice: Subject to any disclaimer, the term of this patent is extended or adjusted under 35 U.S.C. 154(b) by 390 days.

(21) Appl. No.: 17/371,496

(22) Filed: Jul. 9, 2021

(65) Prior Publication Data

US 2021/0333318 A1 Oct. 28, 2021

Related U.S. Application Data

(63) Continuation of application No. PCT/CN2021/079878, filed on Mar. 10, 2021.

(30) Foreign Application Priority Data

Mar. 13, 2020 (CN) .......................... 202010174560.4

(51) Int. Cl.
G01R 31/28 (2006.01)
(52) U.S. Cl.
CPC ................. G01R 31/2858 (2013.01)
(58) Field of Classification Search
CPC .................................................. G01R 31/2858
See application file for complete search history.

(56) References Cited

U.S. PATENT DOCUMENTS

| | | | |
|---|---|---|---|
| 6,825,684 B1* | 11/2004 | Kim | G01R 31/287 257/E21.525 |
| 7,039,566 B2 | 5/2006 | Koike | |
| 7,579,859 B2 | 8/2009 | Liao | |
| 2003/0195728 A1 | 10/2003 | Koike | |
| 2008/0309365 A1 | 12/2008 | Liao | |

FOREIGN PATENT DOCUMENTS

| | | |
|---|---|---|
| CN | 101089642 A | 12/2007 |
| CN | 101740389 A | 6/2010 |
| CN | 102253324 A | 11/2011 |

(Continued)

OTHER PUBLICATIONS

Translation of JP H10107266 A (Year: 1998).*

(Continued)

*Primary Examiner* — Paresh Patel
(74) *Attorney, Agent, or Firm* — Cooper Legal Group, LLC

(57) ABSTRACT

A method for evaluating a Hot Carrier Injection (HCI) effect of a device is provided. The method includes, a ratio of a substrate current to a drain current of a first device at different gate-source voltages is acquired, and recorded as a first current ratio; a ratio of a substrate current to a drain current of a second device at different gate-source voltages is acquired, and recorded as a second current ratio, the second device is subjected to process parameter adjustment or device parameter adjustment relative to the first device; and an influence of the process parameter adjustment or the device parameter adjustment on an HCI effect of the device is determined based on the second current ratio and the first current ratio.

9 Claims, 1 Drawing Sheet

(56) References Cited

FOREIGN PATENT DOCUMENTS

| | | | |
|---|---|---|---|
| CN | 102495345 | A | 6/2012 |
| CN | 103955579 | A | 7/2014 |
| CN | 104237764 | A | 12/2014 |
| CN | 104977519 | A | 10/2015 |
| CN | 105576026 | A | 5/2016 |
| JP | 2005259777 | A | 9/2005 |
| JP | 2013251465 | A | 12/2013 |

OTHER PUBLICATIONS

International Search Report in the international application No. PCT/CN2021/079878, dated Jun. 11, 2021, 2 pgs.
First Office Action of the Chinese application No. 202010174560.4, dated May 25, 2022, 15 pgs.

* cited by examiner

METHOD FOR EVALUATING HOT CARRIER INJECTION EFFECT OF DEVICE

CROSS-REFERENCE TO RELATED APPLICATION

The present application is a U.S. continuation application of International Application No. PCT/CN2021/079878, filed on Mar. 10, 2021, which claims priority to Chinese Patent Application No. 202010174560.4, filed on Mar. 13, 2020. International Application No. PCT/CN2021/079878 and Chinese Patent Application No. 202010174560.4 are incorporated herein by reference in their entireties.

TECHNICAL FIELD

The disclosure relates to the field of semiconductors, and more particularly to a method for evaluating a Hot Carrier Injection (HCI) effect of a device.

BACKGROUND

At present, for the super-large-scale integrated circuit manufacturing industry, with the continuous reduction of the size of a Metal-Oxide-Semiconductor Field Effect Transistor (MOSFET) apparatus, which has been reduced to the sub-micron and deep submicron and is developing to the ultra-deep submicron, the manufacture procedure of a modern semiconductor becomes increasingly advanced, the channel length becomes increasingly shorter, the junction depth becomes increasingly shallower, and the oxide layer becomes increasingly thinner Reliability of a semiconductor integrated circuit is being confronted with an increasingly larger challenge, though having an increasingly lower working voltage. The reliability is of importance to an integrated circuit product. Particularly, in the product research and development process, quick evaluation of the reliability of the product is very important to accelerate the research and development process. Hence, it is crucial to establish a set of quick and effective evaluation mechanism.

In the related art, a device is typically evaluated through an HCI effect. However, although the conventional evaluation on the HCI effect uses the accelerated test, it still needs a long time to finish a whole evaluation on the HCI effect of one device. The whole evaluation cycle is long, thereby slowing down the research and development process.

SUMMARY

The disclosure provides a method for evaluating an HCI effect of a device, which may include the following operations.

A ratio of a substrate current to a drain current of a first device at different gate-source voltages is acquired, and recorded as a first current ratio.

A ratio of a substrate current to a drain current of a second device at different gate-source voltages is acquired, and recorded as a second current ratio, wherein the second device is subjected to a process parameter adjustment or a device parameter adjustment relative to the first device.

An influence of the process parameter adjustment or the device parameter adjustment on an HCI effect of the device is determined based on the second current ratio and the first current ratio.

Details of one or more examples of the disclosure are proposed in the following drawings and descriptions. Other features, objectives and advantages of the disclosure will become apparent from the specification, drawings and claims.

BRIEF DESCRIPTION OF THE DRAWINGS

To better describe and illustrate the examples of the disclosure, reference can be made to one or more drawings. However, additional details or examples for describing the drawings should not be construed as limiting the scope of any one of the creation, present described examples or preferred mode of the disclosure.

DETAILED DESCRIPTION

Figure 1:
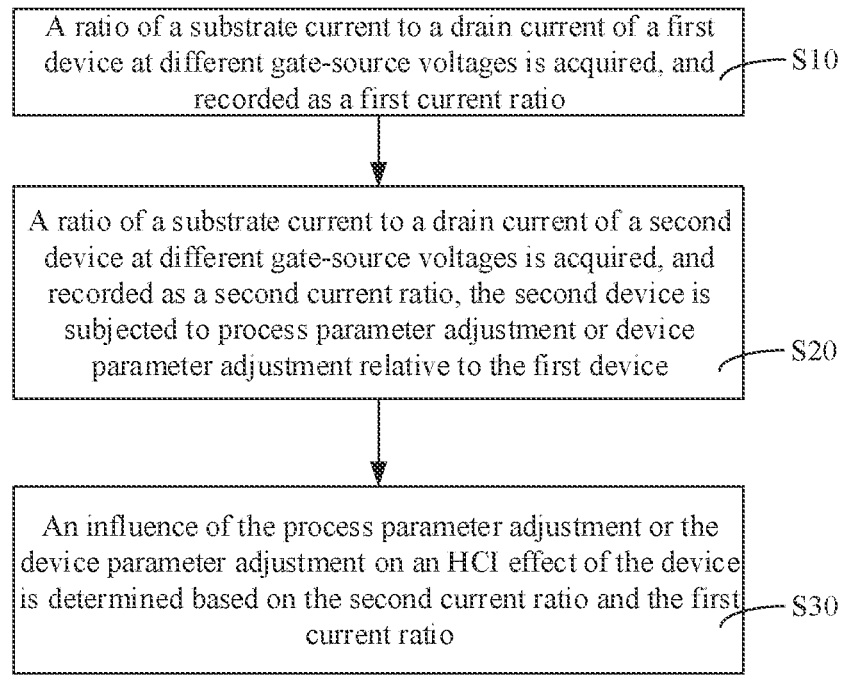
FIG. 1 is a flowchart of a method for evaluating an HCI effect of a device provided by the disclosure.

For the ease of understanding the disclosure, the disclosure is described more completely with reference to related drawings. Preferred examples of the disclosure are given in the drawings. However, the disclosure may be implemented in many different forms and is not limited to the examples described herein. Conversely, these examples are provided to make the disclosures of the disclosure more thorough and complete.

Unless otherwise defined, all technical and scientific terms used herein have a same meaning generally understood by a person skilled in the art to which the disclosure belongs. The terms used in the specification herein are merely to describe the specific examples, rather than to limit the disclosure. The term "and/or" used herein includes one associated item that is listed or any or all possible combinations of associated items that are listed.

The disclosure provides a method for evaluating an HCI effect of a device. As shown in FIG. 1, the method may specifically include the following steps:

In block S10: a ratio of a substrate current to a drain current of a first device at different gate-source voltages is acquired, and recorded as a first current ratio.

In block S20: a ratio of a substrate current to a drain current of a second device at different gate-source voltages is acquired, and recorded as a second current ratio, wherein the second device is subjected to a process parameter adjustment or a device parameter adjustment relative to the first device.

In block S30: an influence of the process parameter adjustment or the device parameter adjustment on an HCI effect of the device is determined based on the second current ratio and the first current ratio.

In an optional embodiment, block S10 may specifically include the following operations.

In S101: the substrate current Isub1 of the first device at the different gate-source voltages Vgs1 is acquired.

In S102: the drain current Ids1 of the first device at the different gate-source voltages Vgs1 is acquired.

In S103: the substrate current Isub1 and the drain current Ids1 of the first device at each gate-source voltage Vgs1 are divided to obtain the first current ratio Isub1/Ids1.

Specifically, in a process of acquiring the ratio of the substrate current Isub1 to the drain current Ids1 of the first device at the different gate-source voltages Vgs1, a source-drain voltage Vds1 between a source and a drain of the first device is set as VCC, both the source and a substrate of the first device are grounded, and the source-drain voltage Vds1 of the first device is not higher than 3 V. The gate-source voltage Vgs1 between a gate and the source of the first device is between 0 V and VCC. In the process of acquiring the ratio of the substrate current Isub1 to the drain current Ids1 of the first device at the different gate-source voltages Vgs1, the gate-source voltage Vgs1 of the first device rises gradually from 0 V, till being equal to the source-drain voltage Vds1 of the first device, and the gate-source voltage Vgs1 rises gradually in a step size of 0.01 V to 0.1 V. In other optional examples, the gate-source voltage Vgs1 may rise gradually in the step size of 0.01 V, 0.05 V or 0.1 V. In the examples, the gate-source voltage Vgs1 may rise gradually in the step size of 0.05 V. In the process of gradually rising the gate-source voltage Vgs1, the substrate current Isub1 and the drain current Ids1 at each gate-source voltage Vgs1 are collected.

In an optional example, block S20 may specifically include the following operations.

In S201: the substrate current Isub2 of the second device at the different gate-source voltages Vgs2 is acquired.

In S202: the drain current Ids2 of the second device at the different gate-source voltages Vgs2 is acquired.

In S203: the substrate current Isub2 and the drain current Ids2 of the second device at each gate-source voltage Vgs2 are divided to obtain the second current ratio Isub2/Ids2.

Specifically, the second device is adjusted in a process parameter or a device parameter relative to the first device. In the process of acquiring the ratio of the substrate current Isub2 to the drain current Ids2 of the second device at the different gate-source voltages Vgs2, a source-drain voltage Vds2 between a source and a drain of the second device is set as VCC, both the source and a substrate of the second device are grounded, and the source-drain voltage Vds2 of the second device is not higher than 3 V. The gate-source voltage Vgs2 between a gate and the source of the second device is between 0 V and VCC. In the process of acquiring the ratio of the substrate current Isub2 to the drain current Ids2 of the second device at the different gate-source voltages Vgs2, the gate-source voltage Vgs2 of the second device rises gradually from 0 V, till being equal to the source-drain voltage Vds2 of the second device, and the gate-source voltage Vgs2 rises gradually in a step size of 0.01 V to 0.1 V. In other optional examples, the gate-source voltage Vgs2 may rise gradually in the step size of 0.01 V, 0.05 V or 0.1 V.

It is to be noted that the gate-source voltage Vgs2 of the second device has the same value range as the gate-source voltage Vgs1 of the first device; and the step size in which the gate-source voltage Vgs2 of the second device gradually rises is the same as the step size in which the gate-source voltage Vgs1 of the first device gradually rises.

S30 may specifically include the following steps.

In S301: a curve showing the change of the first current ratio Isub1/Ids1 over the gate-source voltage Vgs1 of the first device is acquired.

In S302: a curve showing the change of the second current ratio Isub2/Ids2 over the gate-source voltage Vgs2 of the second device is acquired.

In S303: the influence of the process parameter adjustment or the device parameter adjustment on the HCI effect of the device is determined based on the curve showing the change of the first current ratio Isub1/Ids1 over the gate-source voltage Vgs1 and the curve showing the change of the second current ratio Isub2/Ids2 over the gate-source voltage Vgs2.

Specifically, the curve which shows the change of the first current ratio Isub1/Ids1 over the gate-source voltage Vgs1 of the first device is made by taking the first current ratio Isub1/Ids1 as a y axis, and the gate-source voltage Vgs1 of the first device as an x axis; and then, in the same coordinate system, the curve which shows the change of the second current ratio Isub2/Ids2 over the gate-source voltage Vgs2 of the second device is made by taking the second current ratio Isub2/Ids2 as a y axis, and the gate-source voltage Vgs2 of the second device as an x axis.

Figure 2:
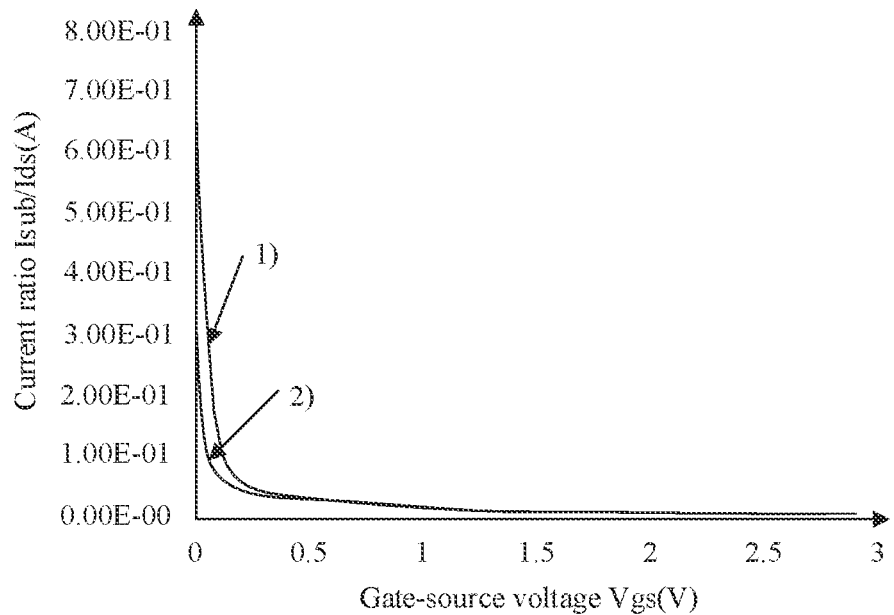
FIG. 2 illustrates, as an example, where both a drain voltage of a first device and a drain voltage of a second device are 2.6 V in a method for evaluating an HCI effect of a device provided by the disclosure, a comparison diagram between a curve showing a change of a first current ratio over a gate-source voltage of the first device and a curve showing a change of a second current ratio over a gate-source voltage of the second device. Curve 1) is the curve showing the change of the first current ratio over the gate-source voltage of the first device, and curve 2) is the curve showing the change of the second current ratio over the gate-source voltage of the second device.

More specifically, as an example, where both the drain voltage Vd1 of the first device and the drain voltage Vd2 of the second device are 2.6 V, the curve 1) showing the change of the first current ratio Isub1/Ids1 over the gate-source voltage Vgs1 of the first device and the curve 2) showing the change of the second current ratio Isub2/Ids2 over the gate-source voltage Vgs2 of the second device are shown as FIG. 2. It is to be noted, in FIG. 2, both the first current ratio Isub1/Ids1 and the second current ratio Isub2/Ids2 are represented as a current ratio Isub/Ids, and both the gate-source voltage Vgs1 of the first device and the gate-source voltage Vgs2 of the second device are represented as a gate-source voltage Vgs.

The method of S30 is as follows: under a same gate-source voltage Vgs, if the second current ratio Isub2/Ids2 is higher than the first current ratio Isub1/Ids1, it is determined that the process parameter adjustment or the device parameter adjustment made on the second device relative to the first device enhances the HCI effect of the device; and if the second current ratio Isub2/Ids2 is lower than the first current ratio Isub1/Ids1, it is determined that the process parameter adjustment or the device parameter adjustment made on the second device relative to the first device reduces the HCI effect of the device.

The technical features of the above examples may be combined freely. In order to describe briefly, the descriptions are not made on all possible combinations of the technical features of the examples. However, the combinations of these technical features should be considered as a scope of the specification as long as there is no conflict.

The method for evaluating the HCI effect, when evaluating the HCI effect of the device, the influence of the adjusted process parameter on the HCI effect of the device is inferred by measuring the substrate current and the drain current of the device at different process parameters, thereby determining whether the HCI effect tends to become good or poor after changing the process parameter. Therefore, the method is able to quickly determine how to adjust the HCI effect, and is not necessary to know the specific service life, greatly shortens the time for evaluating the HCI effect, and accelerates the research and development process.

The above examples only describe several implementation modes of the disclosure. The description is specific and detailed, but cannot be understood as a limit to a scope of the disclosure accordingly. It should be pointed out that multiple changes and improvements may further be made by a person skilled in the art without departing from a concept of the disclosure and they also belong to the protection scope of the disclosure. Therefore, the protection scope of the disclosure shall be subjected to the appended claims.

The invention claimed is:

1. A method for evaluating a Hot Carrier Injection (HCI) effect of a device, comprising:
   acquiring a ratio of a substrate current to a drain current of a first device at different gate-source voltages, and recording the ratio as a first current ratio;
   acquiring a ratio of a substrate current to a drain current of a second device at different gate-source voltages, and recording the ratio as a second current ratio, wherein the second device is subjected to a process parameter adjustment or a device parameter adjustment relative to the first device; and
   determining an influence of the process parameter adjustment or the device parameter adjustment on an HCI effect of the device based on the second current ratio and the first current ratio.

2. The method for evaluating the HCI effect of the device of claim 1, wherein acquiring the ratio of the substrate current to the drain current of the first device at the different gate-source voltages comprises the following steps:
   acquiring the substrate current of the first device at the different gate-source voltages;
   acquiring the drain current of the first device at the different gate-source voltages; and
   dividing the substrate current and the drain current of the first device at each gate-source voltage to obtain the first current ratio.

3. The method for evaluating the HCI effect of the device of claim 1, wherein acquiring the ratio of the substrate current to the drain current of the second device at the different gate-source voltages comprises the following steps:
   acquiring the substrate current of the second device at the different gate-source voltages;
   acquiring the drain current of the second device at the different gate-source voltages; and
   dividing the substrate current and the drain current of the second device at each gate-source voltage to obtain the second current ratio.

4. The method for evaluating the HCI effect of the device of claim 1, wherein in a process of acquiring the ratio of the substrate current to the drain current of the first device at the different gate-source voltages, a source-drain voltage of the first device is set as VCC, both a source and a substrate of the first device are grounded, and the gate-source voltage of the first device is between 0 and VCC; and in a process of acquiring the ratio of the substrate current to the drain current of the second device at the different gate-source voltages, a source-drain voltage of the second device is set as VCC, both a source and a substrate of the second device are grounded, and the gate-source voltage of the second device is between 0 and VCC.

5. The method for evaluating the HCI effect of the device of claim 4, wherein the source-drain voltage of the first device is not higher than 3 V, and the source-drain voltage of the second device is not higher than 3 V.

6. The method for evaluating the HCI effect of the device of claim 1, wherein in a process of acquiring the ratio of the substrate current to the drain current of the first device at the different gate-source voltages, the gate-source voltage rises gradually from 0 to VCC, and the gate-source voltage rises gradually in a step size of 0.01 V to 0.1 V.

7. The method for evaluating the HCI effect of the device of claim 1, wherein in a process of acquiring the ratio of the substrate current to the drain current of the second device at the different gate-source voltages, the gate-source voltage rises gradually from 0 to VCC, and the gate-source voltage rises gradually in a step size of 0.01 V to 0.1 V.

8. The method for evaluating the HCI effect of the device of claim 1, wherein determining the influence of the process parameter adjustment or the device parameter adjustment on the HCI effect of the device based on the second current ratio and the first current ratio comprises:
   acquiring a curve showing a change of the first current ratio over the gate-source voltage of the first device;
   acquiring a curve showing a change of the second current ratio over the gate-source voltage of the second device; and
   determining the influence of the process parameter adjustment or the device parameter adjustment on the HCI effect of the device based on the curve showing the change of the first current ratio over the gate-source voltage and the curve showing the change of the second current ratio over the gate-source voltage.

9. The method for evaluating the HCI effect of the device of claim 8, wherein the method for determining the influence of the process parameter adjustment or the device parameter adjustment on the HCI effect of the device based on the curve showing the change of the first current ratio over the gate-source voltage and the curve showing the change of the second current ratio over the gate-source voltage comprises: under a same gate-source voltage, when the second current ratio is higher than the first current ratio, determining that the process parameter adjustment or the device parameter adjustment enhances the HCI effect of the device; and when the second current ratio is lower than the first current ratio, determining that the process parameter adjustment or the device parameter adjustment reduces the HCI effect of the device.

* * * * *